United States Patent [19]
Naylor

[11] Patent Number: 5,969,658
[45] Date of Patent: Oct. 19, 1999

[54] R/2R LADDER CIRCUIT AND METHOD FOR DIGITAL-TO-ANALOG CONVERTER

[75] Inventor: Jimmy R. Naylor, Tucson, Ariz.

[73] Assignee: Burr-Brown Corporation, Tucson, Ariz.

[21] Appl. No.: 08/972,606

[22] Filed: Nov. 18, 1997

[51] Int. Cl.[6] .................................................. H03M 1/78
[52] U.S. Cl. ........................................ 341/154; 341/145
[58] Field of Search ....................................... 341/145, 154

[56] References Cited

U.S. PATENT DOCUMENTS

| | | | |
|---|---|---|---|
| 3,728,719 | 4/1973 | Fish ........................................... | 341/154 |
| 4,150,366 | 4/1979 | Price ......................................... | 341/120 |
| 4,396,907 | 8/1983 | Wintzer et al. ............................ | 341/54 |
| 4,542,368 | 9/1985 | Lillis ......................................... | 341/118 |
| 4,929,923 | 5/1990 | Dharmadhikari ........................ | 338/308 |

*Primary Examiner*—Marc S. Hoff
*Attorney, Agent, or Firm*—Cahill, Sutton & Thomas P.L.C.

[57] ABSTRACT

A digital-to-analog converter includes an input circuit (9) producing a plurality of corresponding switch control signals (25) in response to a digital input signal ($D_{IN}$) and a resistive ladder network (10A) including an R/2R MSB ladder section (2) including a plurality of "R" resistors (17) and a plurality of "2R" resistors (5), and an R/2R LSB ladder section (3) including a plurality of "R" resistors (17) and a plurality of "2R" resistors (5). A scaling resistor (21) is coupled between a least significant node conductor (7-3) of the MSB ladder section and a most significant node conductor (7-4) of the LSB ladder section. A plurality of switch circuits (6) each selectively conducts a respective parallel resistor circuit (5) to a first reference voltage conductor (VREFH) or a second reference voltage conductor (VREFL) in response to the various switch control signals (25). The resistances of the resistors of the "R" resistors of the MSB ladder section are different than the resistances of the resistors of the "R" resistors of the LSB ladder section. The resistances of the "R" resistors of the MSB ladder section, the resistances of the "R" resistors of the LSB ladder section, and the resistance of the scaling resistor are related by the expression R"=2R−R', where R" is the resistance of a scaling resistor, R is the resistance of the "R" resistors of the MSB ladder section, and R' is the resistance of the "R" resistors of the LSB ladder section.

12 Claims, 5 Drawing Sheets

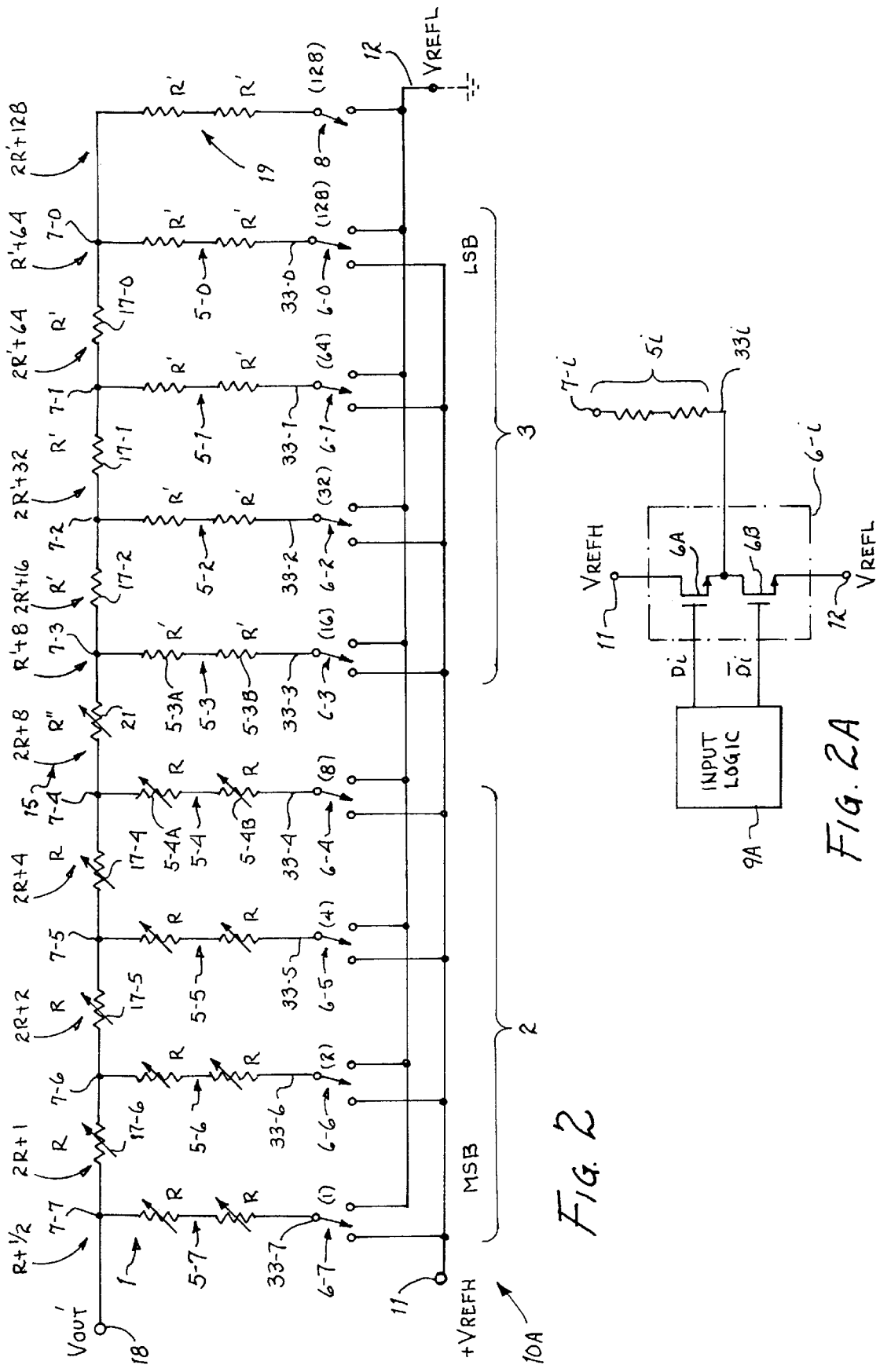
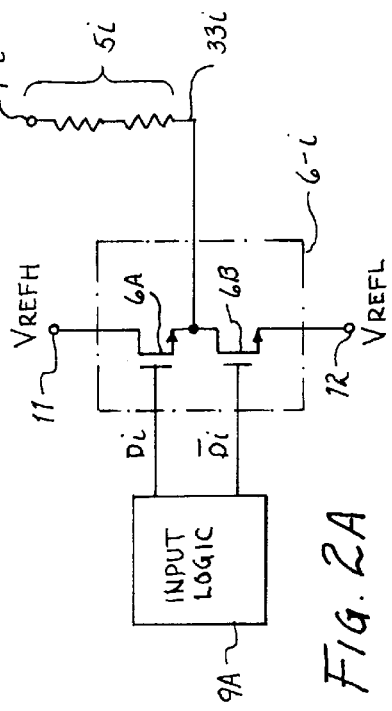
FIG. 2
FIG. 2A

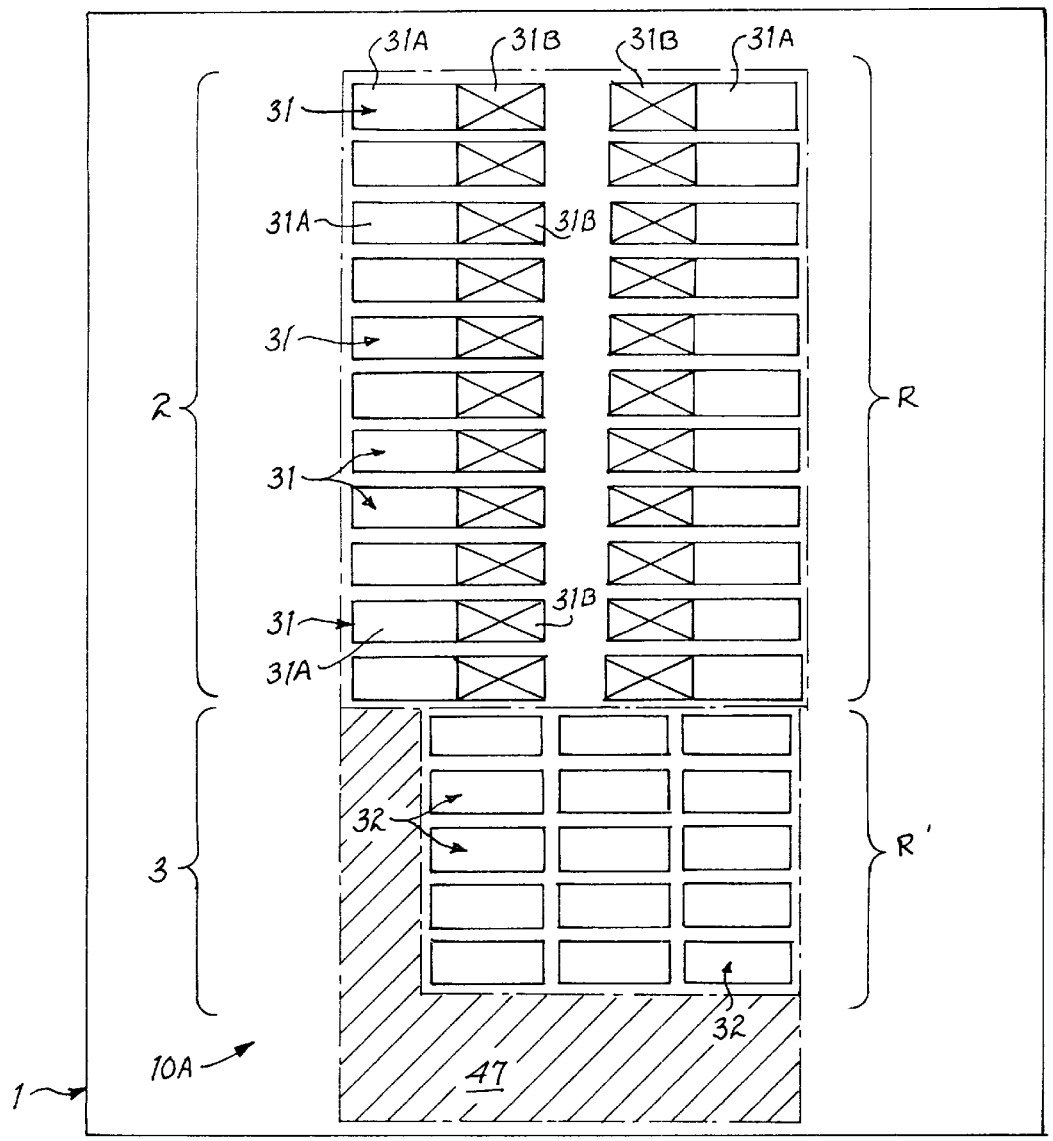
Fig. 3
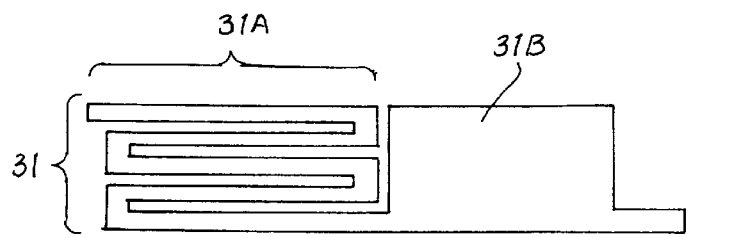
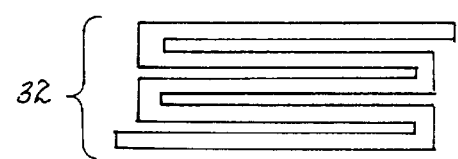
Fig. 3A

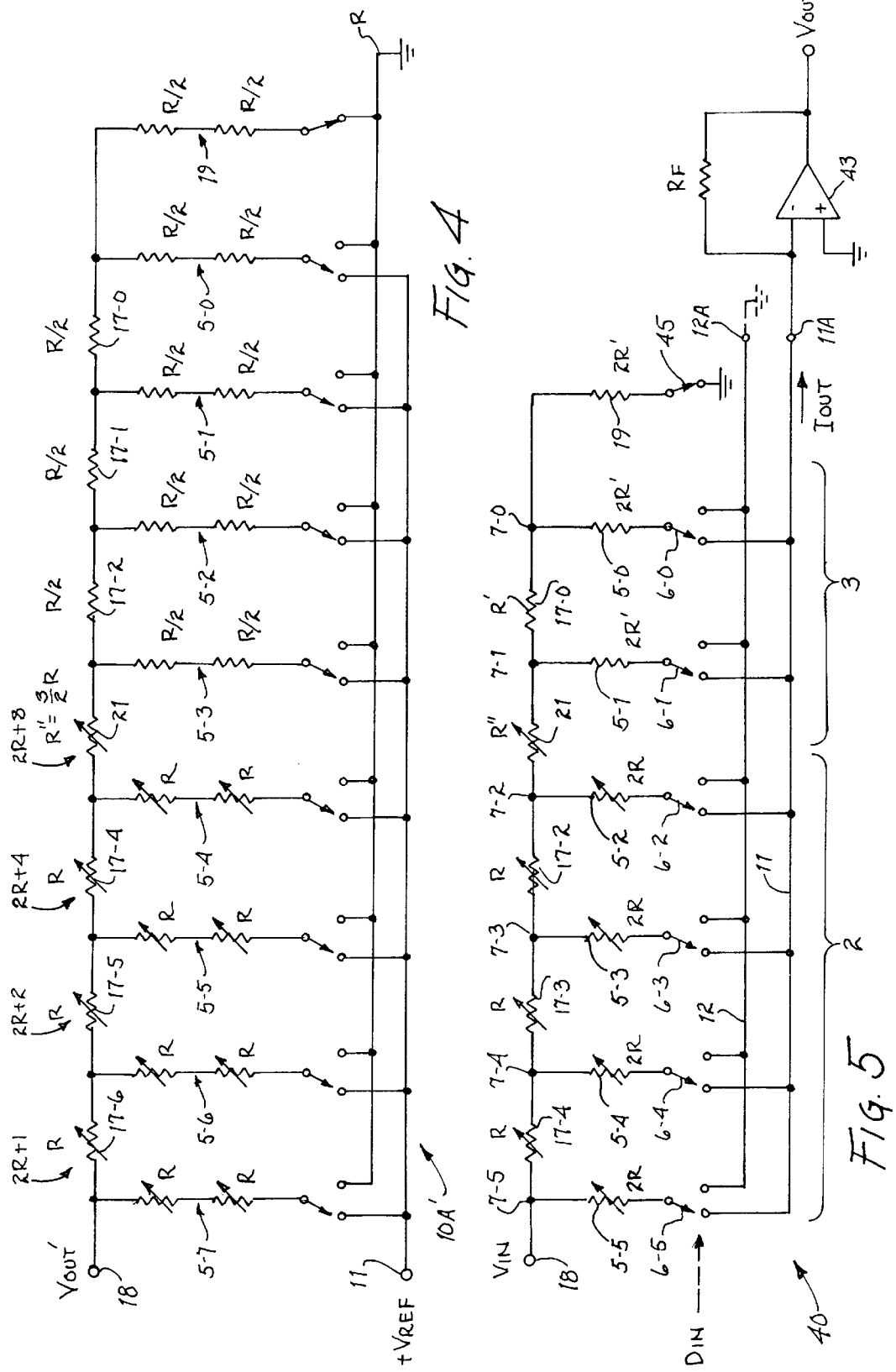

R/2R LADDER CIRCUIT AND METHOD FOR DIGITAL-TO-ANALOG CONVERTER

BACKGROUND OF THE INVENTION

The invention relates to an "R/2R" ladder circuit and technique for reducing the size and cost of an integrated circuit digital-to-analog converter.

The conventional practice of the prior art has been to provide the resistors in the MSB (most significant bit) portion of an R/2R ladder network which are ratio-matched as closely as possible, both with respect to resistance and physical structure, to corresponding resistors in the LSB (least significant bit) portion of the R/2R ladder. Typically, such resistors are formed of nichrome film or other resistive film composition having a sheet resistance of roughly 50 to 2000 ohms per square. Errors due, for example, to variations in semiconductor processing parameters such as the nichrome sheet resistance and mask/photoresist/etching-related processing parameters that occur in the MSB portions of the R/2R ladder have a much larger effect on the accuracy of the digital-to-analog converter than similar variations in the LSB portion. Consequently, the resistors in the MSB portion usually are laser trimmed during manufacture to precisely match the ratios of their desired resistances, but the resistors in the LSB portion usually are not trimmed, since these errors have a much smaller effect on digital-to-analog conversion accuracy. The digital-to-analog conversion accuracy depends more on precise resistance ratio matching of the resistances of the "R" and "2R" resistors of an R/2R ladder network than the absolute value of such resistances. Those skilled in the art know it is impractical to obtain both small absolute value errors and adequately close ratio-matching of resistances at the same time. Therefore, the circuits are designed such that the digital-to-analog conversion accuracy is based on obtaining accurate ratios, rather than absolute values, of resistances of the various resistors.

Typically, laser "trim tabs" are included as part of the nichrome film structure constituting each resistor in both the MSB and LSB portions of the R/2R ladder to obtain the required ratio matching, even though the laser trimming is performed only on the trim tabs in the MSB portion. Although resistors in the LSB portion of the R/2R ladder are not laser trimmed, it nevertheless has been necessary to provide trim tabs on the resistors in the LSB portion to achieve adequate ratio matching even though such untrimmed trim tabs substantially increase the amount of chip area and hence the chip cost.

Those skilled in the art know of another type of digital-to-analog converter, for example, as shown in FIG. 6, that uses switched, equal, constant current sources, instead of the above-mentioned voltage output type switched R/2R ladder technique. The MSB equal constant current sources are selected or deselected according to a thermometer code that represents a digital input word or a most significant group of bits thereof. A least significant group of bits of the digital input word can be utilized to switch a least significant group of equal constant current sources into a "non-switched" R/2R ladder network that performs binary current division to produce an analog output current representing the valued digital input word.

Referring to FIG. 6, the switched constant current circuitry 50 includes a number of NPN current source transistors 63-0,1,2 . . . 7, all having their bases connected to a reference voltage VEF2. The emitters of a most significant (MSB) group 63-4,5,6,7 of the NPN transistors are connected to a group of trimmable "MSB" resistors 52-1,2 . . . 4, each connected to a conductor 58 which receives a bias voltage $V_{REF3}$. Each of the MSB resistors 52-1, . . . 4 has a trim tab and can be trimmed to provide a precise constant current I at the collector of each current source transistor. A trimmable scaling resistor 53, also having a trim tab, is connected between conductor 58 and a conductor 59. Note that the number of MSB transistors such as 63-4,5 . . . and associated emitter resistors such as 52-1,2 . . . depends on the number of binary bits of the digital input word $D_{IN}$ that are utilized to switch the constant current sources formed thereby. For example, if the 2 most significant bits of $D_{IN}$ are so utilized, then only 3 MSB transistors and associated emitter resistors are required. If the 3 most significant bits of $D_{IN}$ are so utilized, then 7 equal switched constant current sources are required. More generally, if N bits of $D_{IN}$ are to be so utilized, then $2^N-1$ MSB transistors and associated emitter resistors are required. Therefore, it is impractical to use more than three or four most significant bits of DN to switch equal constant current sources in a ladder network of a digital-to-analog converter. The most significant N bits of the digital input word $D_{IN}$ are decoded to produce the above mentioned thermometer code which switches the $2^N-1$ constant current sources.

A "LSB" group 63-0,1,2,3 of NPN transistors 63-0,1,2,3 have their bases connected to $V_{REF2}$, and their emitters connected to the upper terminals of "LSB" resistors 51-0, 1,2,3, respectively. Additional less significant NPN transistors could be included in the LSB group, as indicated by the dashed line extensions of the various horizontal conductors on the right side of FIG. 6. The lower terminals of LSB resistors 51-2 and 51-3 are connected to conductor 59. The MSB resistors 52-1,2,3,4 have a resistance $R_E$. LSB resistors 51-2 and 51-3 are trimmable resistors, and also have a resistance of $R_E$. LSB resistors 51-0 and 51-1 are coupled to the emitters of transistors 63-0 and 63-1, respectively, and to conductor 59, and have a resistance $R_E'$ which is less than $R_E$. Any additional less significant bit NPN transistors such as 63-0 and 63-1 and associated emitter resistors such as 51-0 and 51-1 are similarly connected to conductor 59 and have a resistance $R_E'$, and are not trimmable. Constant equal currents I flow in the collectors of the LSB transistors 63-0,1,2,3 and any additional less significant NPN transistors.

The collectors of "MSB" transistors 63-4,5,6,7 are switched, according to corresponding bits of the digital input word, between a reference voltage $V_{REF1}$ (which usually is at ground potential) and a current summing conductor 60 by means of switches 55-1,2 . . . 4 according to a thermometer code derived from the "MSB" bits of the digital input word. The collectors of transistors 63-0,1,2,3 are switched by the LSB bits of the digital input word to the various nodes of a "non-switched" R/2R ladder as shown.

The parameters and design trade-offs which determine the digital-to-analog conversion accuracy of the switched R/2R ladder network DAC to which the present invention relates are quite different from the parameters and design trade-offs which determine the digital-to-analog conversion accuracy of the switched constant current source DAC shown in FIG. 6. For example, switched current source digital-to-analog converters are subject to substantial variations in the current gains of the NPN transistors and in the base-to-emitter ($V_{BE}$) voltages thereof. A complex, expensive reference voltage circuit indicated by a battery 64 in FIG. 6 producing a voltage equal to the difference between $V_{REF2}$ and $V_{REF3}$ is required to compensate for such current gain and $V_{BE}$ variations. The latter parameters constitute a very large portion of the digital-to-analog conversion error. For these and other reasons, switched equal current source digital-to-analog converters generally are not as accurate as switched R/2R digital-to-analog converters of approximately the same cost. Furthermore, the switched equal current source digital-to-analog converters generally require substantially more integrated circuit chip area and dissipate substantially more power than a digital-to-analog converter of comparable cost using a switched R/2R ladder network.

It would be desirable to provide a switched R/2R ladder structure and technique to reduce the physical size of the LSB portion of the R/2R ladder network by eliminating the trim tabs thereof, but without reducing the final accuracy of the digital-to-analog converter (DAC), multiplying digital-to-analog converter (MDAC), or any other circuit using an R/2R ladder.

SUMMARY OF THE INVENTION

Accordingly, it is an object of the invention to provide an integrated circuit digital-to-analog converter which requires less chip area than the closest prior art, without loss of the desired level of digital-to-analog conversion accuracy.

It is another object of the invention to reduce the size of the R/2R ladder portion of an integrated circuit digital-to-analog converter without loss of the desired level of digital-to-analog conversion accuracy.

It is another object of the invention to reduce the cost of a digital-to-analog converter chip by reducing the amount of chip area required by a resistive ladder circuit thereof.

Briefly described, and in accordance with one embodiment thereof, the invention provides a digital-to-analog circuit including an input circuit (9) receiving a digital input signal ($D_{IN}$) and producing in response thereto a plurality of corresponding switch control signals (25) and a resistive ladder network (10A) including an R/2R MSB ladder section (2) including a plurality of node conductors (7), a plurality of "R" resistor circuits (17) each connected to a corresponding node conductor (7) and a plurality of "2R" resistor circuits (5) each connected to the corresponding node conductor (7), an R/2R LSB ladder section (3) including a plurality of node conductors (7), a plurality of "R" resistor circuits (17) each connected to a corresponding node conductor (7), and a plurality of "2R" resistor circuits (5) each connected to a corresponding node conductor (7), and a scaling resistor (21) coupled between a least significant node conductor (7-4) of the MSB R/2R ladder section and a most significant node conductor (7-3) of the LSB R/2R ladder section. A plurality of switch circuits (6) each selectively conduct a respective "2R" resistor circuit (5) to a first reference voltage conductor ($V_{REFH}$) or a second reference voltage conductor ($V_{REFL}$) in response to the various switch control signals (25) depending on the state of a corresponding bit of the digital input signal ($D_{IN}$), a most significant node conductor (7-7) of the MSB R/2R ladder section (2) producing an analog output voltage ($V_{OUT}$) representative of the digital input signal. Each of the "R" resistor circuits (17) includes a resistor, respectively, each of the resistors having a resistance precisely equal to the resistance of the others. Each of the "2R" resistor circuits (5) includes at least one resistor, respectively, wherein each of the resistors of the "2R" resistor circuits (17) of the MSB ladder section (2) includes a laser trim tab, and wherein each of the resistors of the "2R" resistor circuits (5) of the MSB ladder section (2) includes a laser trim tab. Each of the "R" resistor circuits (17) of the LSB ladder section (3) includes a resistor without a laser trim tab, respectively, and each of the "2R" resistor circuits (5) of the LSB ladder section (3) includes at least one resistor without a laser trim tab, respectively. Each of the "2R" resistor circuits (5) of the MSB ladder section (2) includes two resistors, each having a laser trim tab and a resistance equal to the resistance of the resistors of the "R" resistor circuit (17) of the MSB ladder section (2). In the described embodiment each of the "2R" resistor circuits (5) of the LSB ladder section (3) includes two resistors each having a resistance equal to the resistance of the resistors of the series resistor circuits (17) of the LSB ladder section (3). None of the resistors of the "R" resistor circuits or the "2R" resistor circuits (5) of the LSB ladder section (3) include a trim tab.

BRIEF DESCRIPTION OF THE DRAWINGS

FIG. 2 is a schematic of the R/2R ladder network and associated switches in the digital-to-analog converter of FIG. 1.

FIG. 2A is a circuit schematic of one of the switch circuits shown in FIG. 2.

FIG. 3 is a plan view diagram illustrating the physical layout of the R/2R ladder network of FIG. 2 on an integrated circuit chip.

FIG. 3A is an enlarged plan view showing two of the resistors 31 in the MSB portion of the R/2R ladder layout shown in FIG. 3 and one of the resistors 32 in the LSB portion of the R/2R ladder layout.

FIG. 4 is a schematic diagram of an alternative ladder network that can be utilized in lieu of the one shown in FIG. 2.

FIG. 5 is a schematic diagram of an alternative embodiment of the invention commonly known as a multiplying digital-to-analog converter.

DETAILED DESCRIPTION OF THE PREFERRED EMBODIMENT

Figure 1:
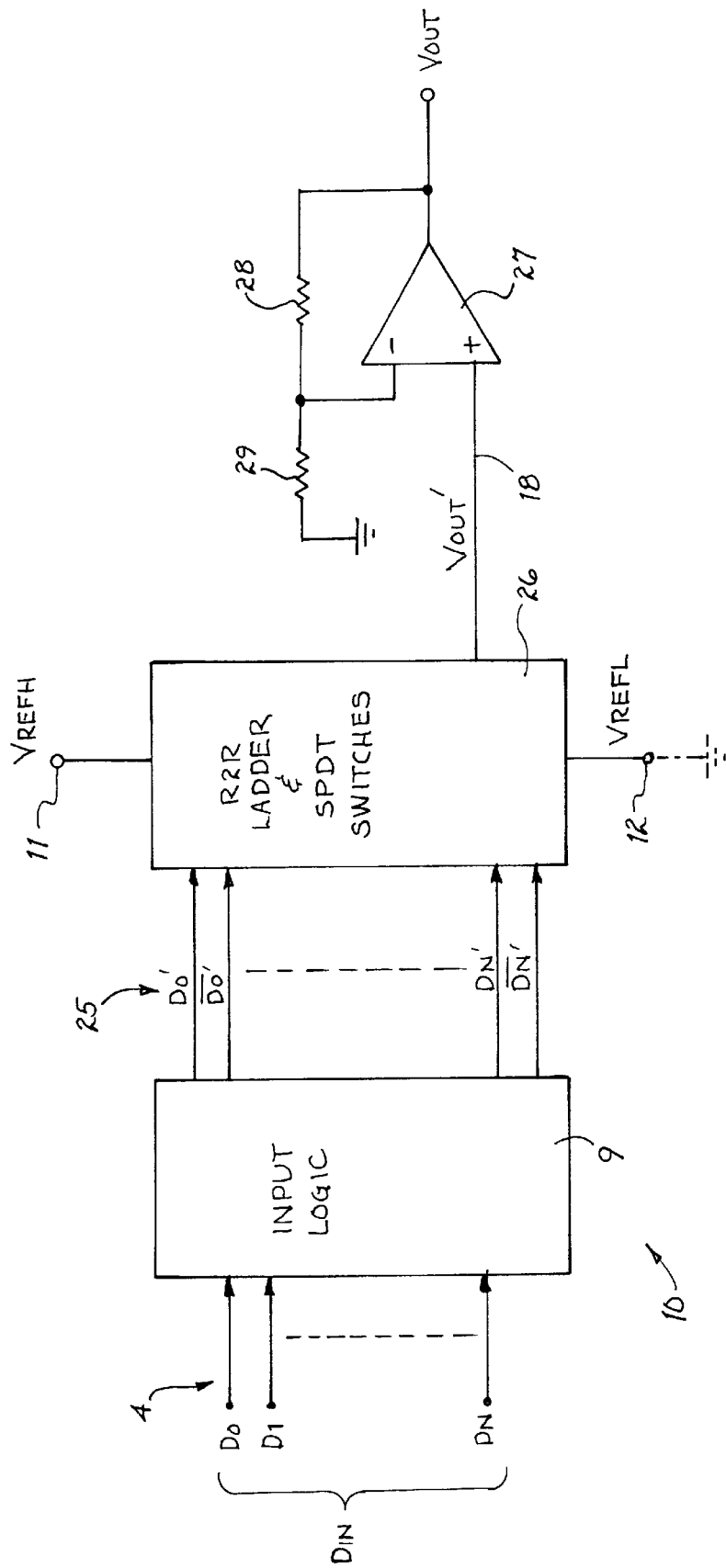
FIG. 1 is a block diagram of a digital-to-analog converter showing the digital interface portion and the R/2R ladder network thereof.
Figure 6:
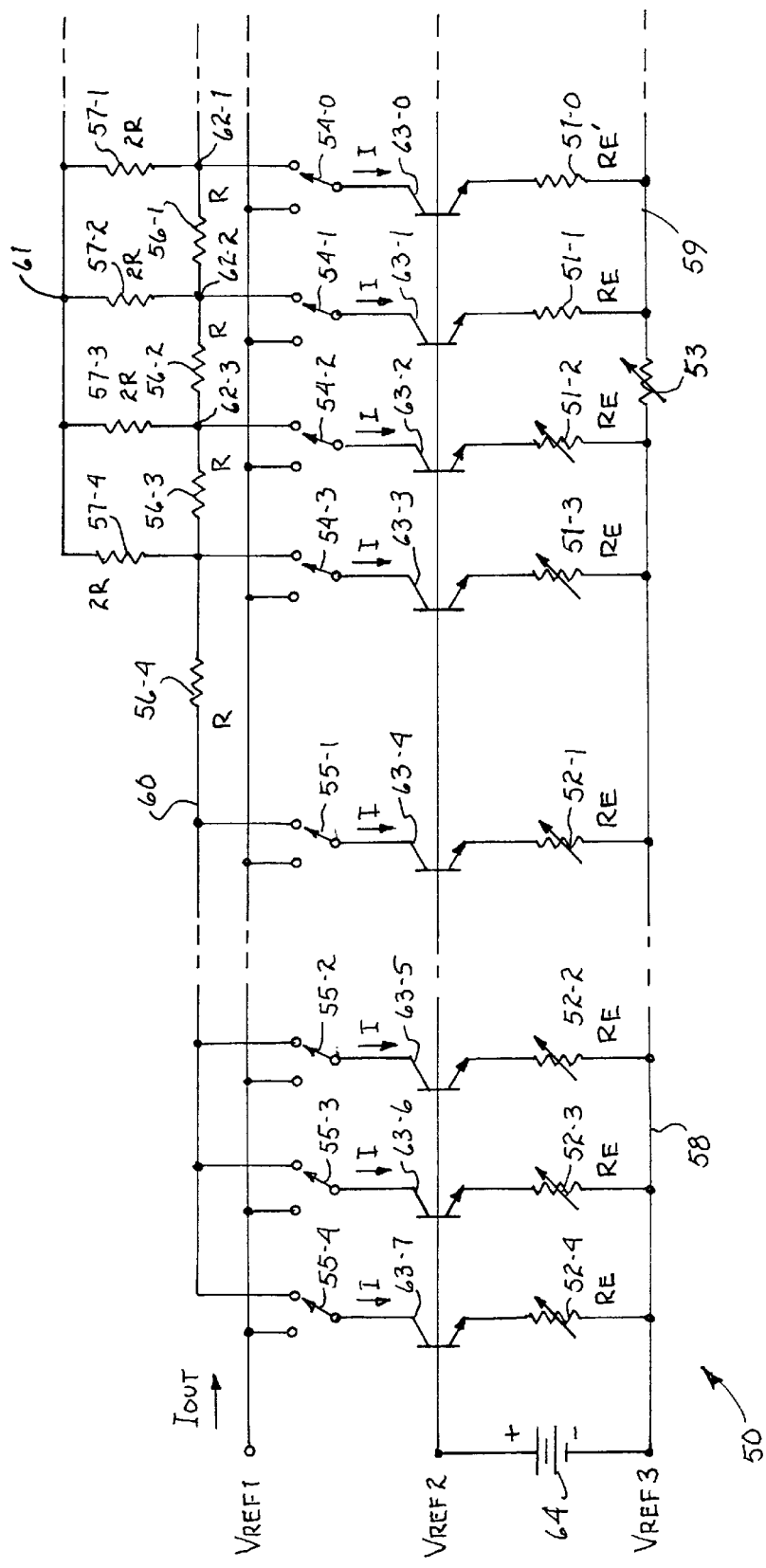
FIG. 6 is a schematic diagram useful in describing the prior art.

Referring to FIG. 1, digital-to-analog converter 10 includes conventional input logic circuitry 9 which receives a digital input word $D_{IN}=D_{0,1 \ldots N}$ on conductors 4. Input logic circuitry 9 produces decoded binary output signals $D_0'$, $\overline{D_0}'$, $D_1'$, $\overline{D_1}'$ ... $D_N'$ and $\overline{D_N}'$ on conductors 25 which are provided as inputs to ladder/switch circuitry 26. The digital input word $D_{IN}$ can be provided in either serial or parallel format, and could, for example, be a binary number, a binary coded decimal number or a Gray code. Input logic 9 can include latches and drivers to produce the binary signals and binary complement signals on conductors 25. Circuitry 26 includes an R/2R ladder formed according to the present invention, and also includes switches controlled by the binary signals 25 to produce the analog signal $V_{OUT}'$ on conductor 18 representing the digital input word $D_{IN}$.

Circuitry 26 is connected between a high reference voltage $V_{REFH}$ on conductor 11 and a low reference voltage $V_{REFL}$ on conductor 12. Conductor 18 is connected to the (+) input of an operational amplifier 27, the (−) input of which is connected to the junction between a resistor 29 and a feedback resistor 28. Resistor 29 has a second terminal connected to ground. The output of amplifier 27 produces the analog output signal VOUT which is coupled by feedback resistor 28 to the (−) input thereof. Operational amplifier 27 functions to provide a gain greater than or equal to 1, for the purpose of scaling the output voltage $V_{OUT}$ relative to the R/2R ladder output $V_{OUT}'$ on conductor 18, and the values of resistors 28 and 29 are selected to provide the desired scaling of the output voltage $V_{OUT}$. (Note that the resistive ladder in block 26 could be an equally weighted parallel resistive ladder (i.e., "segmented resistive ladder") other than an R/2R ladder. For example, a "hybrid" ladder network could be used in which several MSBs of the digital input word are decoded to produce a thermometer code that successively connects equal resistor segments in parallel to provide the required analog signal $V_{OUT}'$ on conductor 18. Some or all of the LSB bits of the digital input word could be used as a binary code to select "2R" legs of an R/2R portion of the ladder network, coupled directly or indirectly by a scaling resistor to the portion including the equal parallel resistor segments. The indirect coupling referred to could be by an R/2R portion of the ladder network included in the MSB section switched by some of the MSB bits of the digital input word.)

Referring to FIG. 2, numeral 10A designates the R/2R resistive ladder network of the eight-bit digital-to-analog converter integrated circuit shown in FIG. 1. FIG. 3 is a drawing of a plot of the mask set from which a twelve-bit version of digital-to-analog converter integrated circuit 10 of FIG. 2 is manufactured. The integrated circuit 10 can be implemented using any of a number of conventional CMOS or BiCMOS processes. In FIG. 2, the resistive ladder network 10A includes an MSB section 2 and an LSB section 3. Ladder network 10A includes eight "2R legs" 5-0,1,2 . . . 7 (also referred to as "parallel" legs or "parallel" resistors") which correspond to the eight bits of the eight-bit DAC, and also includes a termination leg 19. Each of the "2R" legs 5-0,1 . . . 7 is selectively connected by a switch 6-0,1,2 . . . 7, respectively, to a suitable reference voltage, either $+V_{REFH}$ on conductor 11 or $V_{REFL}$ (which may be ground) on conductor 12, depending upon whether the corresponding bit of the digital input word $D_{IN}$ is a "1" or a "0". The "on" resistances of the switches 6-0,1,2 . . . 7 are binarily weighted, as indicated by the numbers in parentheses adjacent to each such switch. For example, the MSB switch 6-7 has one "unit" of resistance, and the LSB switch 6-0 and a termination switch 8 for resistor 19 each have 128 units of resistance. The termination switch 8 permanently connects the termination resistor 19 to $V_{REFL}$.

The upper end of termination resistor 19 and of each "2R" leg 5-0,1,2 . . . 7 is connected to a circuit node 7-0,1,2 . . . 7, respectively. Resistive ladder network 10A also includes seven "R" resistors 17-0,1,2, scaling resistor 21, and resistors 17-4,5,6 (also referred to as "series" resistors) coupled between the various nodes 17-0,1 . . . 7 as shown.

Note the arrows above the MSB portion 2 of ladder network 10A in FIG. 2, each pointing generally to the right. Each of these arrows indicates the ideal resistance that should be "seen" (after laser trimming is complete) looking into the portion of the resistive ladder network located to the right of that point.

One skilled in the art will realize that in order to maintain binarily weighted bit voltages at the ladder output, the "on" resistances of the various switches 6-0,1 . . . 7 and termination switch 8 must be binarily weighted according to the binary weighting of the corresponding bits respectively of the digital input word. For example, the resistances 2R+1 (the "1" representing the one "unit" of resistance of the associated switch 6-7), 2R+2, and 2R+4 should be "seen" as indicated for the MSB portion 2 of the ladder network. Note that each of the resistors in the MSB portion 2 has a resistance R and is shown with an arrow through it; such arrow means that the resistor is laser-trimmable. The various trimmable resistors are trimmed to obtain a very precise matched resistance ratios with each other, because precise resistance ratios, rather than absolute values of resistance, are what is important to the accuracy and linearity of the digital-to-analog converter.

FIG. 2A shows one way of implementing the "i"th "2R" leg of the R/2R ladder circuit 10A and the corresponding switches in block 26 of FIG. 1, where i=0,1 . . . 7. A portion 9A of the input logic 9 generates the binary, preferably non-overlapping, signals $D_i$ and $\overline{D_i}$ for the "i"th bit. The signal $D_i$ is applied to the gate of an N-channel MOSFET 6A having its drain connected by conductor 11 to $V_{REFH}$ and its source connected by conductor 33-i to the lower terminal of a "2R" resistor leg 5-i having its upper terminal connected to node 7-i of R/2R ladder network 10A. Similarly, $\overline{D_i}$ is connected to the gate of N-channel MOSFET 6B, the source of which is connected by conductor 12 to $V_{REFL}$. The drain of MOSFET 6B is connected to conductor 33-i.

FIG. 3 shows the layout of the above mentioned twelve-bit version of the R/2R ladder network 10A on the surface of an integrated circuit chip 1, wherein the MSB portion 2 includes trimmable resistors 31 of resistance R (including all of the trimmable resistors 5-4,5,6,7, 17-4,5,6 and 21 shown in FIG. 2). The LSB section 3 includes non-trimmable resistors 32 of resistance R' (including non-trimmable resistors 5-0,1,2,3, 17-0,1,2 and 19 in FIG. 2).

In accordance with the present invention, none of the non-trimmable resistors 32 in LSB section 3 have trim tabs. As shown in FIG. 3A, each resistor, such as nichrome film resistor 31 in MSB section 2, includes a serpentine portion 31A and a nichrome trim tab portion 31B connected in series with the serpentine portion 31A. The solid trim tab 31B can be laser trimmed to precisely trim the resistor 31. During manufacture, the values of the various resistors such as 31 can be precisely laser trimmed to achieve the desired level of resistance ratio matching by cutting predetermined patterns into the trim tab portions thereof to increase their resistances to achieve the desired level of resistance ratio matching. FIG. 3A also shows a non-trimmable resistor 32 of LSB section 3, which includes only a serpentine portion but no trim tab.

The resistance R' of the LSB section 3 may be approximately equal to or somewhat larger than the trimmable resistance R of the resistors 5-4,5 . . . 7 and the other trimmable resistors 17-4,5,6 and 21 in the MSB portion 2 of the resistive ladder network, or alternatively, the resistance R' can have a substantially lower value than the resistance R, as subsequently explained.

It can been seen by comparing the physical size of the LSB resistor area 3 in FIGS. 3 and 3A to the much larger size of the MSB resistor area 2 that there is a great reduction in the amount of chip area required for the LSB portion 3, because in accordance with the present invention, the trim tabs of all of the LSB resistors 5-0,1 . . . 3 and 17-0,1,2 and 19 of resistance R' have been omitted. In FIG. 3, numeral 47 represents the amount of chip area saved by eliminating the trim tabs from the LSB section 3. The resistor 21 (FIG. 2) is laser trimmed to increase its resistance until the above 2R+8 value indicated by arrow 15 is obtained. This "scales" the weighting of the LSB section 3 to the MSB section 2 such that precisely binarily weighted bits are obtained, without the use of any trim tabs in LSB section 3.

To summarize, in accordance with the present invention, trim tabs have been omitted from the resistors in LSB portion 3 of the ladder network, and one laser trimmable scaling resistor 21 having a trim tab is provided between the MSB portion 2 and the LSB portion 3 as shown in FIG. 3. It can be seen that if the resistor 21 is laser trimmed so that the resistance looking to the right from the point indicated by arrow 15 is exactly 2R+8 (the "8" designating 8 units of "on" resistance of the switches), then the correct value of $V_{OUT}'$ will be obtained, provided the trimmable resistors in the MSB area 2 all have been properly laser trimmed.

It has been found that the invention provides the advantage of substantially reduced amounts of chip area for the R/2R ladder network of a digital-to-analog converter, with no significant loss in digital-to-analog conversion accuracy.

FIG. 4 illustrates a modified embodiment 10A' of the R/2R ladder network similar to ladder network 10A of FIG. 2, except that the scaling resistor 21 has a nominal value of 1.5R and all of the resistors in parallel resistive legs 5-0,1,2,3 and termination resistor leg 19 all have a non-trimmable resistance value of R/2. Thus, the desired matching by laser trimming of resistor 21, to provide the impedance indicated at the point indicated by arrow 15 to be exactly 2R+8 at the end of the laser trimming operation, allows lower values of resistances R' to be used, provided that the value R" of resistor 21 is scaled up in value so that the impedance indicated by arrow 15 is 2R+8, as discussed previously. The desired resistance R" of resistor 21 is equal to 2R−R'. This allows the amount of area required for LSB section 3 to be even further reduced.

FIG. 5 is a diagram of a conventional "MDAC", or multiplying DAC 40, in which an R/2R resistive ladder supplies an output current through a first summing conductor 11 into the (−) input of an operational amplifier 43 having a feedback resistor RF coupled between its output and its (−) input. MDAC 40 includes an R/2R ladder which can be essentially the same as ladder 10A of FIG. 2. Similar reference numerals are used to designate similar parts in FIGS. 3 and 5, and for convenience only six "2R" legs are shown. The (+) input of operational amplifier 43 is connected to ground, so it functions as a current-to-voltage converter to produce a voltage $V_{OUT}$ which is equal to the product of the analog input voltage $V_{IN}$ multiplied by the digital input word $D_{IN}$. Switches 6-0,1,2 . . . 5 couple the "2R" legs to first summing conductor 11 or second summing conductor 12 in response to the binary logic outputs of an input circuit receiving the digital input signal $D_{IN}$ as in FIG. 1. One of the first and second summing conductors 11 and 12 is connected to the (−) input of operational amplifier 43, which maintains that summing conductor at a virtual ground. The other summing conductor is connected to an actual ground, as indicated by the dotted lines. The resistance of each of legs 5-0, 5-1, and 19 is 2R'. The resistance of each of legs 5-2,3 . . . 5 is 2R. The resistance of resistor 17-0 is R'. The resistance of scaling resistor 21 is R". Resistors 21, 5-2,3,4,5,17-2,3,4 have trim tabs, and resistors 17-0,5-0,5-1, and 19 do not have trim tabs. Switch 45 permanently connects termination resistor 19 to ground to ensure that the resistance of switch 45 is combined with the resistance 2R' of termination resistor 19 to properly terminate the ladder network of MDAC 40. Conductor 18 is connected to receive an analog signal $V_{IN}$, and an output current $I_{out}$ is produced in conductor 11.

The MDAC circuit 40 produces an analog output voltage $V_{OUT}$ which is proportional or equal to the product of the analog input voltage $V_{IN}$ multiplied by the value of the digital input signal $D_{IN}$. The above described techniques of omitting LSB trim tabs and using a scaling resistor 21 are as equally applicable to MDAC 40 of FIG. 5 as for DAC 10 of FIG. 1.

While the invention has been described with reference to several particular embodiments thereof, those skilled in the art will be able to make the various modifications to the described embodiments of the invention without departing from the true spirit and scope of the invention. It is intended that all elements or steps which are insubstantially different than corresponding elements or steps of the prior art and/or which perform substantially the same function in substantially the same way to achieve the same result are within the scope of the invention.

What is claimed is:

1. A digital-to-analog converter comprising:
   (a) an input circuit receiving a digital input signal and producing in response thereto a plurality of corresponding switch control signals;
   (b) a resistive ladder network including
      i. an R/2R MSB ladder section including a plurality of node conductors, a plurality of series resistor circuits each connected to a corresponding node conductor and a plurality of parallel resistor circuits each connected to the corresponding node conductor,
      ii. an R/2R LSB ladder section including a plurality of node conductors, a plurality of series resistor circuits each connected to a corresponding node conductor, and a plurality of parallel resistor circuits each connected to a corresponding node conductor,
      iii. a scaling resistor coupled between a least significant node conductor of the MSB ladder section and a most significant node conductor of the LSB ladder section; and
   (c) a plurality of switch circuits each selectively conducting a respective parallel resistor circuit to a first reference voltage conductor or a second reference voltage conductor in response to the various switch control signals depending on the state of a corresponding bit of the digital input signal, a most significant node conductor of the MSB ladder section producing an analog output voltage representative of the digital input signal, wherein the resistances of the resistors of the series resistor circuits of the MSB ladder section are different than the resistances of the resistors of the series resistor circuits of the LSB ladder section, and the resistances of the resistors of the series resistor circuits of the MSB ladder section, the resistances of the resistors of the series resistor circuits of the LSB ladder section, and the resistance of the scaling resistor are related by the expression R"=2R−R', where R" is the resistance of a scaling resistor, R is the resistance of the series resistors of the MSB ladder section, and R' is the resistance of the series resistors of the LSB ladder section.

2. A digital-to-analog converter comprising:
   (a) an input circuit receiving a digital input signal and producing in response thereto a plurality of corresponding switch control signals;
   (b) a resistive ladder network including
      i. an R/2R MSB ladder section including a plurality of node conductors, a plurality of series resistor circuits each connected to a corresponding node conductor and a plurality of parallel resistor circuits each connected to the corresponding node conductor,
      ii. an R/2R LSB ladder section including a plurality of node conductors, a plurality of series resistor circuits each connected to a corresponding node conductor, and a plurality of parallel resistor circuits each connected to a corresponding node conductor,
      iii. a scaling resistor coupled between a least significant node conductor of the MSB ladder section and a most significant node conductor of the LSB R/2R ladder section; and (c) a plurality of switch circuits each selectively conducting a respective parallel resistor circuit to a first reference voltage conductor or a second reference voltage conductor in response to the various switch control signals depending on the state of a corresponding bit of the digital input signal, a most significant node conductor of the MSB ladder section producing an analog output voltage representative of the digital input signal, wherein each of the series resistor circuits of the MSB ladder section includes a resistor, respectively, each of such resistors having a resistance precisely equal to the resistance of the resistors of the other series resistor circuits of the MSB ladder section, and each of the parallel resistor circuits of the MSB ladder section includes at least one resistor, respectively, and wherein each of such resistors has a resistance precisely equal to the resistance of the resistors of the other parallel circuits, wherein each resistor of each of the series resistor circuits of the MSB ladder section includes a laser trim tab and each resistor of each of the parallel resistor circuits of the MSB ladder section includes a laser trim tab, wherein each of the series resistor circuits of the LSB ladder section includes a resistor, respectively, each of such resistors having a resistance precisely equal to the resistance of the resistors of the other series resistor circuits of the LSB ladder section, and each of the parallel resistor circuits of the LSB ladder section includes at least one resistor, respectively, and wherein each of such resistors has a resistance precisely equal to the resistance of the resistors of the other parallel circuits, and wherein each of the series resistor circuits of the LSB ladder section includes a resistor without a laser trim tab, respectively, and each of the parallel resistor circuits of the LSB ladder section includes at least one resistor without a laser trim tab, respectively.

3. The digital-to-analog converter of claim 2 where the scaling resistor includes a laser trim tab.

4. The digital-to-analog converter of claim 3 wherein each of the parallel resistor circuits of the MSB ladder section includes two resistors, each having a laser trim tab and a resistance equal to the resistance of the resistors of the series resistor circuits of the MSB ladder section.

5. The digital-to-analog converter of claim 4 wherein each of the parallel resistor circuits of the LSB ladder section includes two resistors each having a resistance equal to the resistance of the resistors of the series resistor circuits of the LSB ladder section.

6. The digital-to-analog converter of claim 3 wherein no resistors of the series resistor circuits or the parallel resistor circuits of the LSB ladder section include a trim tab.

7. A digital-to-analog converter comprising:
(a) an input circuit receiving a digital input signal and producing in response thereto a plurality of corresponding switch control signals;
(b) a resistive network including
   i. an MSB section including a plurality of resistor circuits each coupled to a first conductor,
   ii. an R/2R LSB ladder section including a plurality of node conductors, a plurality of series resistor circuits each connected to a corresponding node conductor, and a plurality of parallel resistor circuits each connected to a corresponding node conductor,
   iii. a scaling resistor coupled between the first conductor of the MSB section and a most significant node conductor of the LSB ladder section; and
(c) a plurality of switch circuits each selectively conducting a respective parallel resistor circuit to a first reference voltage conductor or a second reference voltage conductor in response to the various switch control signals, depending on the state of a corresponding bit of the digital input signal, a most significant node conductor of the first conductor producing an analog output voltage representative of the digital input signal,
wherein the resistances of the resistors of the series resistor circuits of the MSB section are different than the resistances of the resistors of the series resistor circuits of the LSB ladder section.

8. A digital-to-analog converter comprising:
(a) an input circuit receiving a digital input signal and producing in response thereto a plurality of corresponding switch control signals;
(b) a resistive network including
   i. an MSB section including a plurality of resistor circuits each coupled to a first conductor,
   ii. an R/2R LSB ladder section including a plurality of node conductors, a plurality of series resistor circuits each connected to a corresponding node conductor, and a plurality of parallel resistor circuits each connected to a corresponding node conductor,
   iii. a scaling resistor coupled between the first conductor of the MSB section and a most significant node conductor of the LSB ladder section; and
(c) a plurality of switch circuits each selectively conducting a respective resistor circuit to a first reference voltage conductor or a second reference voltage conductor in response to the various switch control signals, depending on the state of a corresponding bit of the digital input signal, a most significant node conductor of the first conductor producing an analog output voltage representative of the digital input signal,
wherein each of the resistors of the MSB section has a resistance precisely equal to the resistance of the resistors of the other resistors of the MSB section,
wherein each resistor of the MSB section includes a laser trim tab,
and wherein each of the series resistor circuits of the LSB ladder section includes a resistor without a laser trim tab, respectively, and each of the parallel resistor circuits of the LSB ladder section includes at least one resistor without a laser trim tab, respectively.

9. In a digital-to-analog converter, a resistive ladder network comprising:
(a) an R/2R MSB ladder section including a plurality of node conductors, a plurality of series resistor circuits each connected to a corresponding node conductor and a plurality of parallel resistor circuits each connected to the corresponding node conductor;
(b) an R/2R LSB ladder section including a plurality of node conductors, a plurality of series resistor circuits each connected to a corresponding node conductor, and a plurality of parallel resistor circuits each connected to a corresponding node conductor;
(c) a scaling resistor coupled between a least significant node conductor of the MSB R/2R ladder section and a most significant node conductor of the LSB R/2R ladder section; and
(d) a plurality of switch circuits each selectively conducting a respective parallel resistor circuit to a first reference voltage conductor or a second reference voltage conductor in response to a corresponding switch control signal depending on the state of a corresponding bit of a digital input signal, a most significant node conductor of the MSB R/2R ladder section producing an analog output voltage representative of the digital input signal, wherein each of the series resistor circuits of the MSB ladder section includes a resistor, respectively, each of such resistors having a resistance precisely equal to the resistance of the resistors of the other series resistor circuits of the MSB ladder section, and each of the parallel resistor circuits of the MSB ladder section includes at least one resistor, respectively, and wherein each of such resistors has a resistance precisely equal to the resistance of the resistors of the other parallel circuits, wherein each resistor of each of the series resistor circuits of the MSB ladder section includes a laser trim tab and each resistor of each of the parallel resistor circuits of the MSB ladder section includes a laser trim tab, wherein each of the series resistor circuits of the LSB ladder section includes a resistor, respectively, each of such resistors having a resistance precisely equal to the resistance of the resistors of the other series resistor circuits of the LSB ladder section, and each of the parallel resistor circuits of the LSB ladder section includes at least one resistor, respectively, and wherein each of such resistors has a resistance precisely equal to the resistance of the resistors of the other parallel circuits, and wherein each of the series resistor circuits of the LSB ladder section includes a resistor without a laser trim tab, respectively, and each of the parallel resistor circuits of the LSB ladder section includes at least one resistor without a laser trim tab, respectively.

10. In a multiplying digital-to-analog converter, a resistive ladder network comprising:

(a) an R/2R MSB ladder section including a plurality of node conductors, a plurality of series resistor circuits each connected to a corresponding node conductor and a plurality of parallel resistor circuits each connected to the corresponding node conductor;

(b) an R/2R LSB ladder section including a plurality of node conductors, a plurality of series resistor circuits each connected to a corresponding node conductor, and a plurality of parallel resistor circuits each connected to a corresponding node conductor;

(c) a scaling resistor coupled between a least significant node conductor of the MSB R/2R ladder section and a most significant node conductor of the LSB R/2R ladder section; and (d) a plurality of switch circuits each selectively conducting a respective parallel resistor circuit to a first summing conductor or a second summing conductor in response to a corresponding switch control signal depending on the state of a corresponding bit of a digital input signal, a most significant node conductor of the MSB R/2R ladder section receiving an analog input voltage by which the digital input signal is to be multiplied, wherein each of the series resistor circuits of the MSB ladder section includes a resistor, respectively, each of such resistors having a resistance precisely equal to the resistance of the resistors of the other series resistor circuits of the MSB ladder section, and each of the parallel resistor circuits of the MSB ladder section includes at least one resistor, respectively, and wherein each of such resistors has a resistance precisely equal to the resistance of the resistors of the other parallel circuits, wherein each resistor of each of the series resistor circuits of the MSB ladder section includes a laser trim tab and each resistor of each of the parallel resistor circuits of the MSB ladder section includes a laser trim tab, wherein each of the series resistor circuits of the LSB ladder section includes a resistor, respectively, each of such resistors having a resistance precisely equal to the resistance of the resistors of the other series resistor circuits of the LSB ladder section, and each of the parallel resistor circuits of the LSB ladder section includes at least one resistor, respectively, and wherein each of such resistors has a resistance precisely equal to the resistance of the resistors of the other parallel circuits, and wherein each of the series resistor circuits of the LSB ladder section includes a resistor without a laser trim tab, respectively, and each of the parallel resistor circuits of the LSB ladder section includes at least one resistor without a laser trim tab, respectively.

11. The multiplying digital-to-analog converter of claim 10 including a current-to-voltage converter having an input coupled to one of the first and second summing conductors.

12. In a multiplying digital-to-analog converter, a resistive ladder network comprising:

(a) an MSB section including a plurality of resistor circuits each coupled to a first conductor, (b) an R/2R LSB ladder section including a plurality of node conductors, a plurality of series resistor circuits each connected to a corresponding node conductor, and a plurality of parallel resistor circuits each connected to a corresponding node conductor;

(c) a scaling resistor coupled between a least significant node conductor of the MSB section and a most significant node conductor of the LSB ladder section; and (d) a plurality of switch circuits each selectively conducting a respective parallel resistor circuit to a first summing conductor or a second summing conductor in response to a corresponding switch control signal depending on the state of a corresponding bit of a digital input signal, a most significant node conductor of the MSB R/2R ladder section receiving an analog input voltage by which the digital input signal is to be multiplied, wherein each of the resistors of the MSB section has a resistance precisely equal to the resistance of the resistors of the other resistors of the MSB section, wherein each resistor of the MSB section includes a laser trim tab, and wherein each of the series resistor circuits of the LSB ladder section includes a resistor without a laser trim tab, respectively, and each of the parallel resistor circuits of the LSB ladder section includes at least one resistor without a laser trim tab, respectively.

* * * * *